United States Patent [19]

Inayat-Khan

[11] 4,364,619
[45] Dec. 21, 1982

[54] INTERCONNECTION SYSTEM FOR PRINTED CIRCUIT BOARD DEVICES

[75] Inventor: Gayan Inayat-Khan, Inglewood, Calif.

[73] Assignee: Mattel, Inc., Hawthorne, Calif.

[21] Appl. No.: 252,557

[22] Filed: Apr. 9, 1981

[51] Int. Cl.³ .......................... H05K 1/14; A63F 9/00
[52] U.S. Cl. ............................... 339/17 F; 273/85 G; 339/176 MF; 200/61.1; 200/5 A
[58] Field of Search .......... 339/17 F, 17 M, 176 MF; 273/85 G; 200/5 A, 61.1

[56] References Cited

U.S. PATENT DOCUMENTS

| | | | |
|---|---|---|---|
| 3,350,530 | 10/1967 | Fry | 200/166 |
| 3,383,487 | 5/1968 | Wiener | 200/168 |
| 3,745,288 | 7/1973 | Reimer | 200/166 PC |
| 3,911,234 | 10/1975 | Kotaka | 200/5 A |
| 4,028,509 | 6/1977 | Zurcher | 200/5 A |
| 4,060,889 | 12/1977 | Zielinski | 339/17 F |
| 4,066,851 | 1/1978 | White et al. | 200/5 A |
| 4,143,253 | 6/1979 | Wagner et al. | 200/5 A |
| 4,145,584 | 3/1979 | Otterlei | 200/5 A |
| 4,306,716 | 12/1981 | James et al. | 273/85 G |
| 4,310,318 | 1/1982 | Carlson | 273/1 E |
| 4,314,312 | 2/1982 | Donmoyer et al. | 339/17 F |
| 4,322,074 | 3/1984 | James et al. | 273/85 G |

Primary Examiner—Vance Y. Hum
Assistant Examiner—Leo P. Picard
Attorney, Agent, or Firm—John G. Mesaros; Max E. Shirk; Ronald M. Goldman

[57] ABSTRACT

A system for interconnecting electrically conductive portions of first and second members, at least one of which contains a foldable printed circuit lamina looped over the edge of a support portion and urged into mechanical contact with the electrically conductive portion of the second member, there being provided an indexing tab for positioning the so-connected members in aligned relation.

16 Claims, 15 Drawing Figures

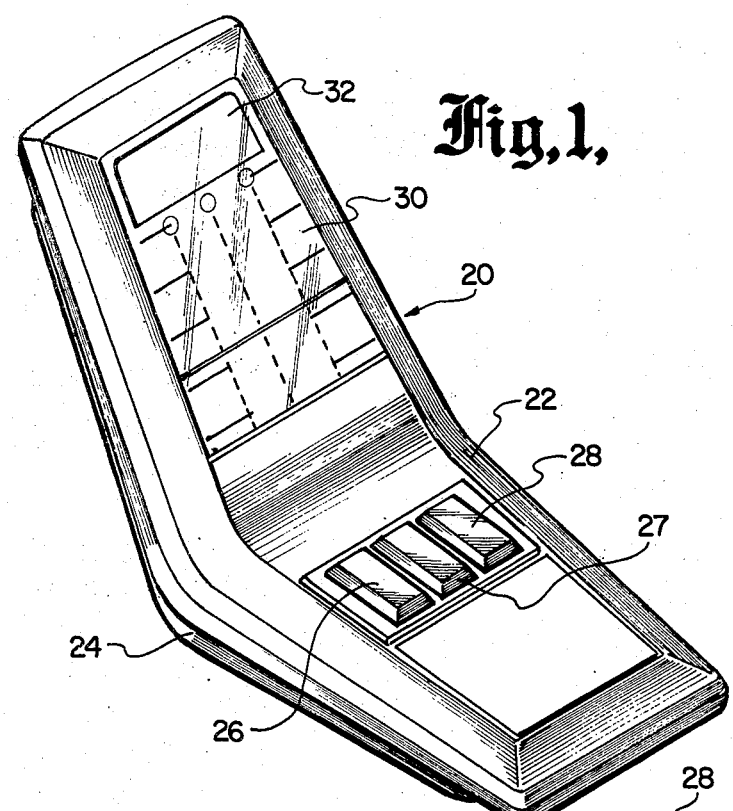
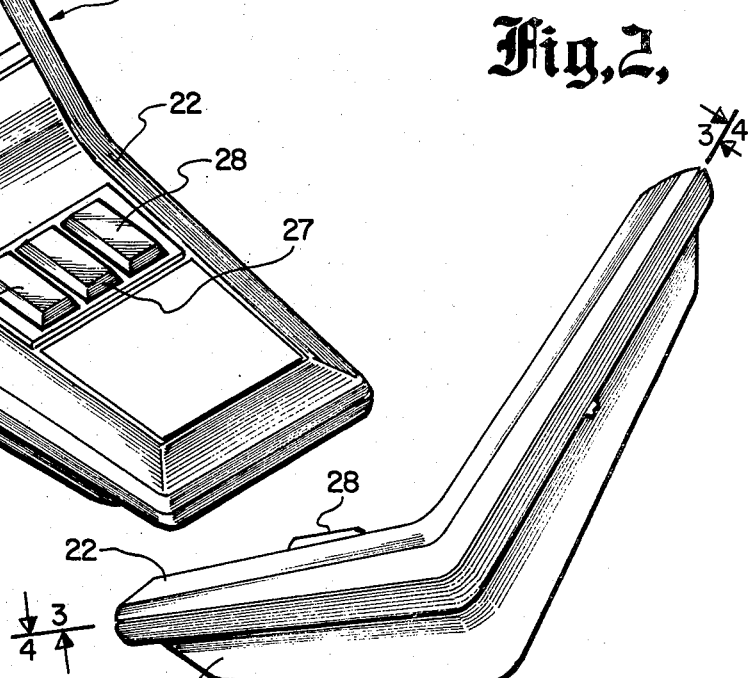
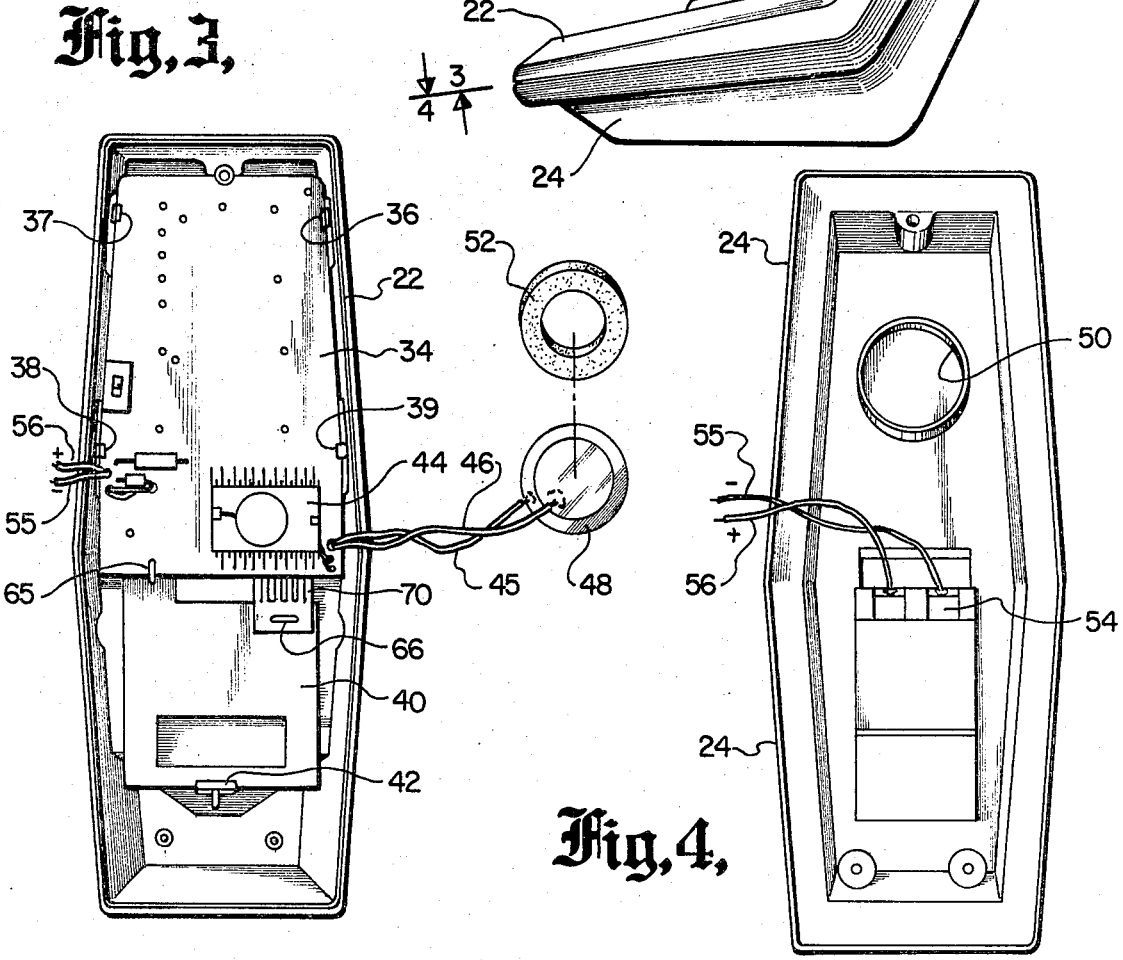
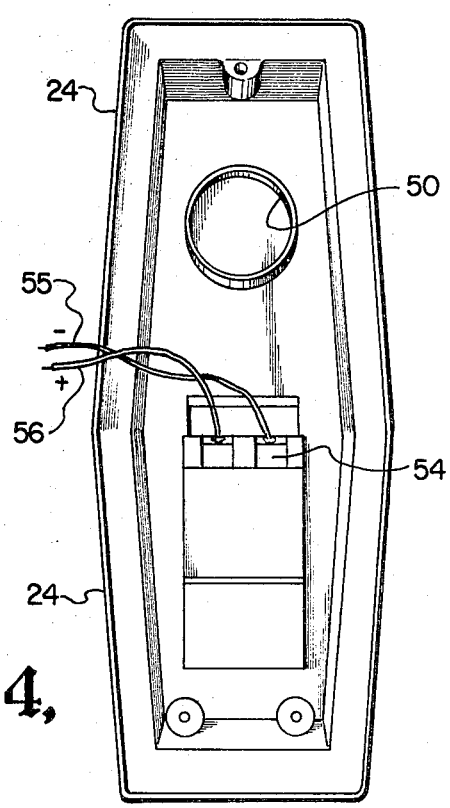

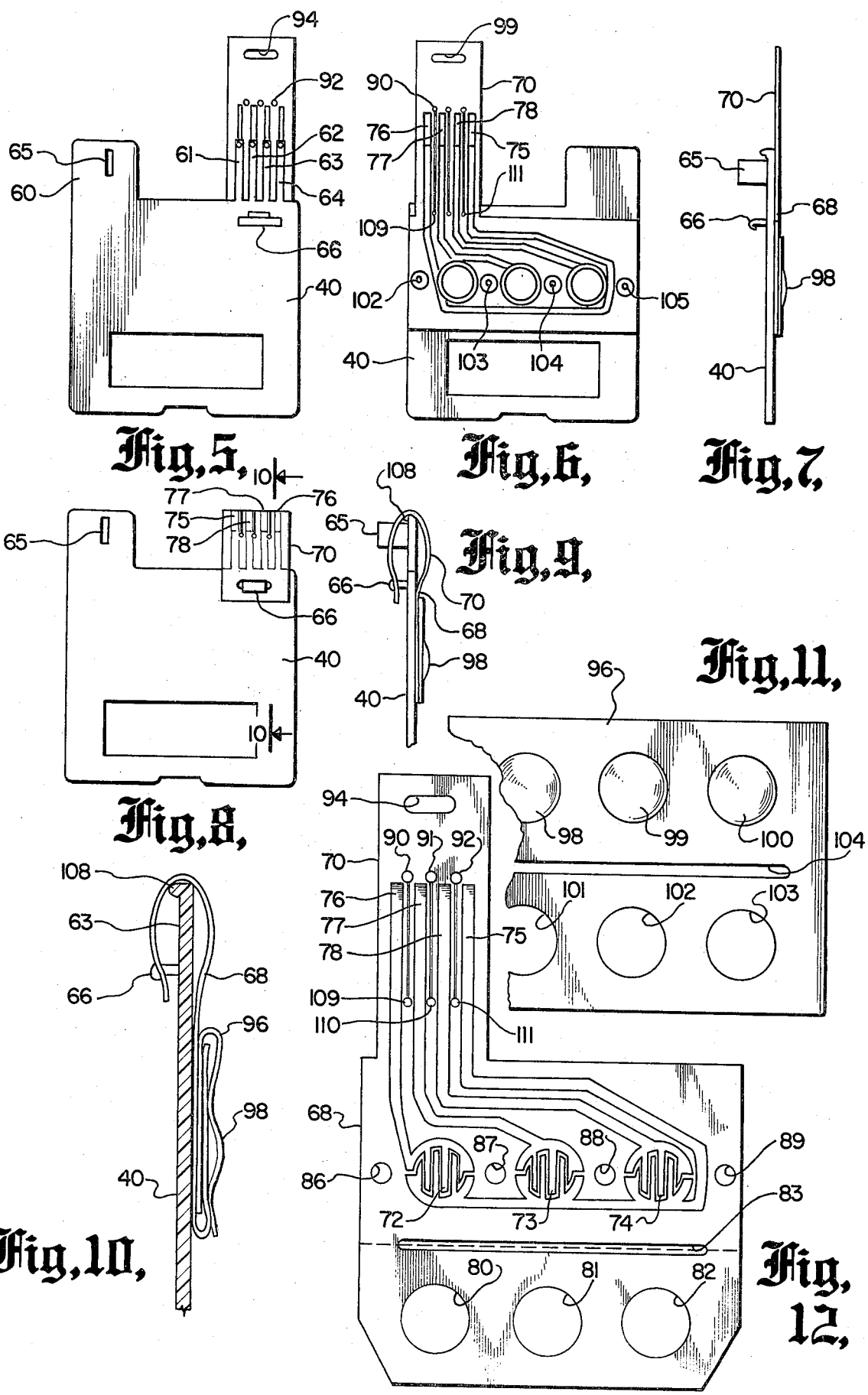

INTERCONNECTION SYSTEM FOR PRINTED CIRCUIT BOARD DEVICES

BACKGROUND OF THE INVENTION

The background of the invention will be discussed in two parts:

Field of the Invention

This invention relates to an interconnection system and more particularly to a construction for interconnecting separate electrical circuitry supporting members.

Description of the Prior Art

Printed circuitry provides for rapid and economical assembling of electronic devices. In more recent years, flexible printed circuit lamina has become popular particularly as a means for providing switch assemblies formed on one substrate or lamina which is then folded to provide an intermediate insulating layer between opposing conductive layers. Such uses of flexible printed circuits are shown and described for example in the following U.S. Pat. Nos. 3,911,234 issued Oct. 7, 1975 to Kotaka entitled "Keyboard Type Switch Assembly Having Fixed and Movable Contacts Disposed on Foldable Flexible Printed Circuit Board"; 4,066,851 issued Jan. 3, 1978 to White, et al entitled "Keyboard Switch Assembly Having Foldable Printed Circuit Board, Integral Spacer and Preformed Depression-type Alignment Fold"; 4,143,253 issued Mar. 6, 1979 to Wagner, et al entitled "Optically Clear Membrane Switch"; 4,028,509 issued June 7, 1977 to Zurcher entitled "Simplified Tabulator Keyboard Assembly for use in Watch-/Calculator Having Transparent Foldable Flexible Printed Circuit Board with Contacts and Actuator Indicia"; 3,383,487 issued May 14, 1968 to Wiener entitled "Thin Flexible Magnetic Switch"; 4,145,584 issued Mar. 20, 1979 to Otterlei entitled "Flexible Keyboard Switch with Integral Spacer Intrusions"; 3,350,530 issued Oct. 31, 1967 to Fry entitled "Switches for use with Flexible Printed Circuits"; and 3,745,288 issued July 10, 1973 to Reimer entitled "Flexible Printed Wiring Switch".

In such prior art switching devices, the resilience of the flexible lamina is used to advantage for switch construction by providing opposing conductive surfaces in spaced relation (usually with an insulating sheet therebetween) for indicating switch closures upon deformation of one conductive area toward the other.

However, in such prior art devices if a discontinuity exists, for example, between one printed circuit board edge and another, conventional means of interconnection have been by the use of separate connectors, soldering, and the use of clips or the like for maintaining facing conductive strips or edges in electrical contact with each other.

It is an object of the present invention to provide a new and improved interconnection system.

It is another object of the present invention to provide a new and improved interconnection system in which one member is provided with a flexible printed circuit lamina.

It is still another object of the present invention to provide a new and improved structure for providing electrical contact between a flexible printed circuit member and an electrical component or adjacent printed circuit board.

SUMMARY OF THE INVENTION

The foregoing and other objects of the invention are accomplished by providing a flexible printed circuit lamina having a tail section thereof folded over an edge portion of a support member. A second generally rigid member is provided with electrical contact portions positioned for abutting engagement with the electrically conducted portions of the folded over tail section with mating indexing means being provided on the support member on opposing adjacent surfaces of the support member and the generally rigid member for aligning the contact portions. With the parts positioned within a supporting structure such as a housing, structure within the housing urges the so-folded tail section into abutting engagement with the electrical contact portions.

Other objects, features and advantages of the invention will become apparent from a reading of the specification when taken in conjunction with the drawings in which like reference numerals refer to the like elements in the several views.

BRIEF DESCRIPTION OF THE DRAWINGS

FIG. 1 is a perspective view of an electronic game device which utilizes the interconnection system according to the invention;

FIG. 2 is a side elevational view of the electronic game device of FIG. 1;

FIG. 3 is a rear view of the upper part of the housing of the game device of FIG. 1 as viewed generally along line 3—3 of FIG. 2 and illustrating the interior component parts;

FIG. 4 is a front view of the bottom portion of the housing of the electronic game device of FIG. 1 as viewed generally along line 4—4 of FIG. 2;

FIG. 5 is a rear plan view of one of the circuit board members for the interconnection system according to the invention with the printed circuit lamina in partially assembled relation thereon;

FIG. 6 is a front view of the circuit board member and printed circuit lamina of FIG. 5;

FIG. 7 is a side elevational view of the circuit board member and printed circuit lamina of FIG. 5;

FIG. 8 is a rear view of the circuit board member of FIG. 5 with the flexible printed circuit lamina in its fully assembled position;

FIG. 9 is a side elevational view of the flexible lamina and circuit board member of FIG. 5;

FIG. 10 is an enlarged partial cross-sectional view taken along line 10—10 of FIG. 9;

FIG. 11 is a plan view, partially broken away of a switch lamina used for the assembly of FIG. 6;

FIG. 14 is an enlarged end view, partially broken away, depicted the interconnection of the first and second members according to the invention.

DESCRIPTION OF THE PREFERRED EMBODIMENT

Figure 13:
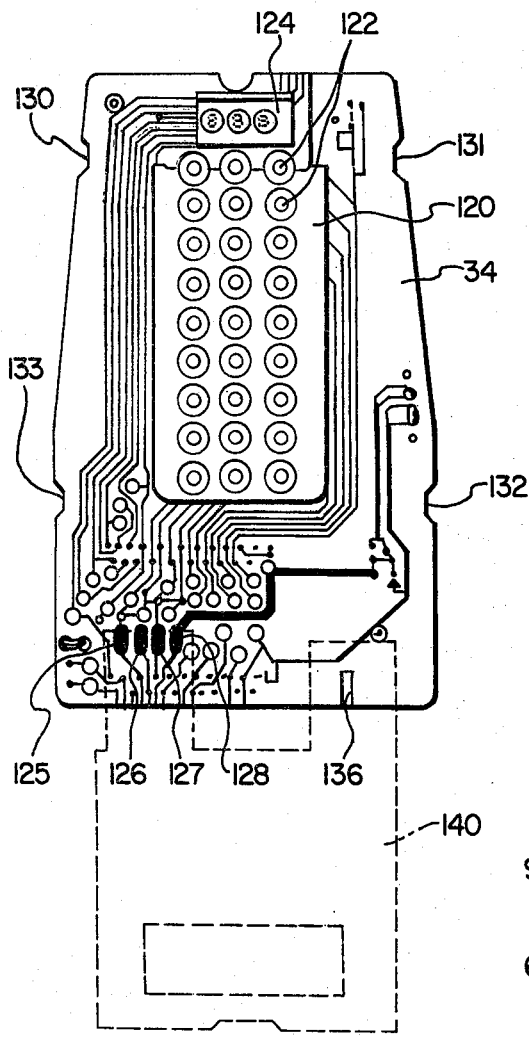
FIG. 13 is a front plan view of the printed circuit board member with the illuminatable segments of the playing field thereon with the second member being shown in dotted lines.

Referring now to the drawings and particularly to FIGS. 1 and 2 there is shown an electronic game apparatus generally designated 20 which includes a housing formed of upper and lower housing portions 22 and 24 respectively. The upper housing portion 22 includes a keyboard area having three manually depressable switches 26–28 and a playing field area including a translucent playing field 30 and a scoring area 32, the scoring area traditionally including a multiple digit light emitting diode or liquid crystal display for providing numerals indicative of certain scoring events or time dependent events during play of the game 20. As illustrated in FIGS. 1 and 2, the housing formed of the upper and lower housing portions 22 and 24, in side elevational view, has the keyboard portion on that portion of the housing which would rest on a surface such as a table, with the playing field 30 being angularly disposed relative to the plane of the keyboard area to facilitate ready viewing during play of the game.

As will hereinafter be described, with the angular housing construction, first and second members are contained within the housing with the two members being angularly disposed, one member carrying the necessary components and printed circuitry associated with the keyboard area, and the second member having mounted or assembled thereon the necessary components and printed circuitry for the playing field area 30 and scoring area 32.

FIGS. 3 and 4 illustrate respectively reverse views of the upper housing portion 22 and lower housing portion 24 with the component parts assembled therein just prior to final assembly of securing the two housing portions together.

By reference to FIG. 3, the components assembled within the interior of the upper housing portion 22 include a first member 34 which is a generally planar generally rigid printed circuit board member configured for being retained within the upper housing portion 22 by means of inwardly extending deformable tabs or tangs 36–39.

Assembled within the lower angularly disposed portion of the upper housing portion 22 is a second member 40 which includes the keyboard components, the member 40 being retained by means of a tab or tang 42 formed within the housing 22 for gripping a lower edge of the member 40 while the upper edge, as will hereinafter be described, is retained within the housing portion 22 by means of the abutting relation against the lower portion or edge of the first member 34. The second member 40 is a generally rigid generally planar generally rectangular member with both members 34 and 40 preferably being formed of insulating material such as plastic or other suitable printed circuit board substrate material. By reference briefly to FIG. 6, FIG. 13 and FIG. 15, the first member 34 includes those components and printed circuitry for the playing field 30 and scoring area 32, while the second member 40 receives thereon those components for the keyboard area or switch portion.

Referring to FIGS. 3 and 4, the reverse side of the first member 34 is illustrated and has certain electrical components mounted thereon such as a suitable microprocessor chip 44 with electrical conductors 45 and 46 leading therefrom to a speaker member 48 which is received within a recess 50 of the lower housing portion 24 with a foam annular ring 52 therebetween. A suitable power source such as a battery 54 is housed within a compartment (not shown) in the lower portion of the lower housing portion 24. Although not illustrated, the electrical leads 55 and 56 from the battery connector are suitably connected to the terminals on the main printed circuit board member 34.

By reference now to FIGS. 5 through 12, the details pertaining to the construction of the keyboard portion components on the second support member 40 will be described. As illustrated in FIG. 5, the member 40 is generally rectangular with the upper edge portion thereof having a first extension 60 and a plurality of deformable resilient extensions 61–64 extending generally parallel thereto adjacent the opposite long side thereof. The projection 60 includes a generally perpendicular integrally formed indexing tab 65. In proximity to, and below the resilient projections 61–64, there is integrally formed in the member 40 a generally perpendicularly extending tab or tang member 66.

Figure 12:
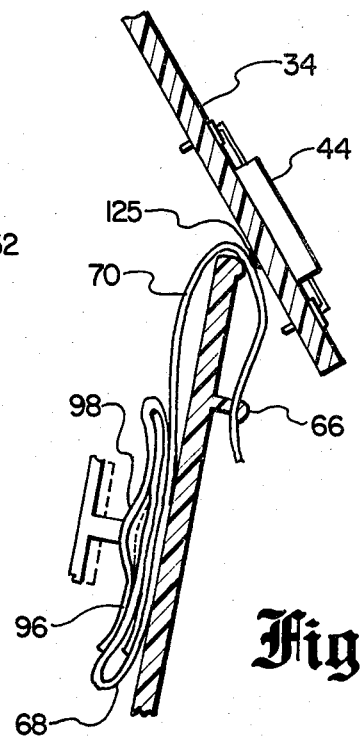
FIG. 12 is a plan view of a flexible circuit lamina showing the printed circuit conductors thereon utilizing the assembly of FIG. 6.

By reference also to FIGS. 11 and 12, the switch construction will be described. The switch construction includes a first flexible printed circuit lamina 68 (shown in FIG. 12) which is generally rectangular with an upwardly extending tail section 70. Imprinted or etched on the surface thereof is an array or pattern of conductive strips with appropriate conductive leads for forming the switch assembly. The array or pattern of conductive material defines first, second and third switch areas 72, 73 and 74 respectively with each of these areas being essentially circular in configuration and having interleaved, spaced, first and second sets of conductive patterns, the lower sets being mutually connected to each other and to a conductive strip 75 for forming a common or ground lead. The interleaved portions of the area 72–74 are each provided with an individual conductive lead portion 76–78 respectively with the terminal ends of the leads 75–78 being generally parallel to each other and extending onto the tail section portion 70. By reference also to FIGS. 5 and 6, it can be seen that the spacing adjacent conductive strips 75–78 generally correspond to the spacing between the plurality of projections 61–64 on the second member 40.

The lamina 68 is further provided with a plurality of enlarged apertures 80–82 adjacent one end thereof with an elongated rectangular slit or slot 83 extending transversely across the lamina 68 to provide a fold line which, with the lamina 68 folded thereon, aligns the apertures 80–82 with the conductive switch area 72–74 respectively.

In aligned relation, in general alignment with the switch areas 72–74, there are other fastening apertures 86–89 formed in lamina 68 for enabling the assembly thereof to the support member 40. In proximity to the terminal ends of the conductive leads 75–78, three apertures 90–92 are formed at locations intermediate adjacent pairs of conductive strips with an elongate aperture 94 being formed transversely adjacent the terminal portion of the tail section 70.

By reference to FIG. 11, there is a generally rectangular flexible printed circuit lamina 96 having dome-shaped portions 98–100 formed therein in aligned relation with the dome-shaped portions 98–100 being of circular configuration and having etched fully thereon a conductive layer on the concave portion thereof. Spaced below and aligned with the dome-shaped portions 98–100, the lamina 96 also includes enlarged circular apertures 101–103 of generally the same size as the apertures 80-82 on the lamina 68. Transversely bisecting the lamina 96 is an elongate slit 104 which serves as a fold line for the lamina 96 during assembly.

In assembling the keyboard portion, by reference to FIGS. 5 through 7, the lamina 68 is positioned on the support board or member 40 with the tail section 70 in aligned relation with the projection 61-64 and the apertures 86-89 suitably positioned over plastic studs 102-105 inclusive, the plastic studs then being suitably deformed much as in the manner of rivets for securing the lamina 68 to the support board or member 40. By reference to FIGS. 8 through 10, the tail section 70 is then folded or looped over the projections 61-64 with the aperture 94 thereof being engaged by the tab or tang 66 and, as illustrated in FIG. 8, the conductive strips 75-78 extend over to the rearward side of the support member 40. As shown in FIG. 10, each of the projections 61-64 (only one of which is shown) includes a rearwardly extending ridge portion 108 to form a broad terminal edge of the finger or projection 64 for facilitating the looping (as opposed to flat bending) of the tail section 70.

To permit each of the conductive strip portions 75-78 to act individually as spring-like contact members, by reference again to FIG. 12, additional perforations or apertures 109-111 may be formed in the lamina 68 in vertical alignment with the apertures 90-92 with the material therebetween being provided with slits. With these additional apertures and slits, each of the conductors 75-78 in conjunction with its own resilient finger or projection 61-64 acts as a spring-like contact member in the interconnection system as will hereinafter be described.

By reference again to FIG. 10, the lamina 96 is folded along the fold slot 104 and interleaved with the folded over section of lamina 68 so that the portion of lamina 96 containing apertures 101-103 is most proximate to the conductive switch area 72-74 of lamina 68 with the fold end of lamina 68 then being folded over that portion so that apertures 80-82 align with apertures 101-103 with the dome-shaped portions 98-100 of lamina 96 facing outwardly from the support board or member 40. The interleaved sections of substrate or lamina are then suitably secured to the member 40. For this purpose, although not shown, the lamina 96 may be provided with suitable apertures such as shown in dotted lines, and the fold section of lamina 68 may be provided with suitable apertures as shown in dotted lines, with the apertures so formed being in the same general alignment as apertures 86 through 89 with all apertures then being received over the studs 102-105 prior to securing.

By reference to FIG. 13, the member 34 may be a conventional generally rigid printed circuit board having a conductive array imprinted thereon with a first subassembly 120 having a matrix of illuminatable segments 122 such as light emitting diodes mounted thereon for defining the playing field 30. A second subassembly 124 may be a three digit numeric display viewable through the scoring area 32 of the game 20. Other suitable conductors or conductive portions are etched or assembled to the member 34 with the lower lefthand corner thereof carrying four cover contact pads 125, 126, 127 and 128. As shown in FIG. 14 for the pad 125, the pads 125-128 provide contact connection points for abuttingly engaging the conductive strip areas 75-78, respectively, of the circuit lamina 68 of the second member 40. In the particular embodiment shown herein for purposes of illustration, but not of limitation, three switches with four leads are required for interconnection of the switch assembly to the integrated circuit to provide the necessary input signals. For this purpose, the tail section 70 of the lamina 68 is provided with four conductors 75-78 and the plurality of resilient finger-like projections 61-64 likewise, total four in number, with the combined effect of the resilient finger-like projections and the flexible resilient nature of the lamina 68 acting as abutting spring contacts for engaging the pads 125-128 for providing the electrical connection.

Figure 15:
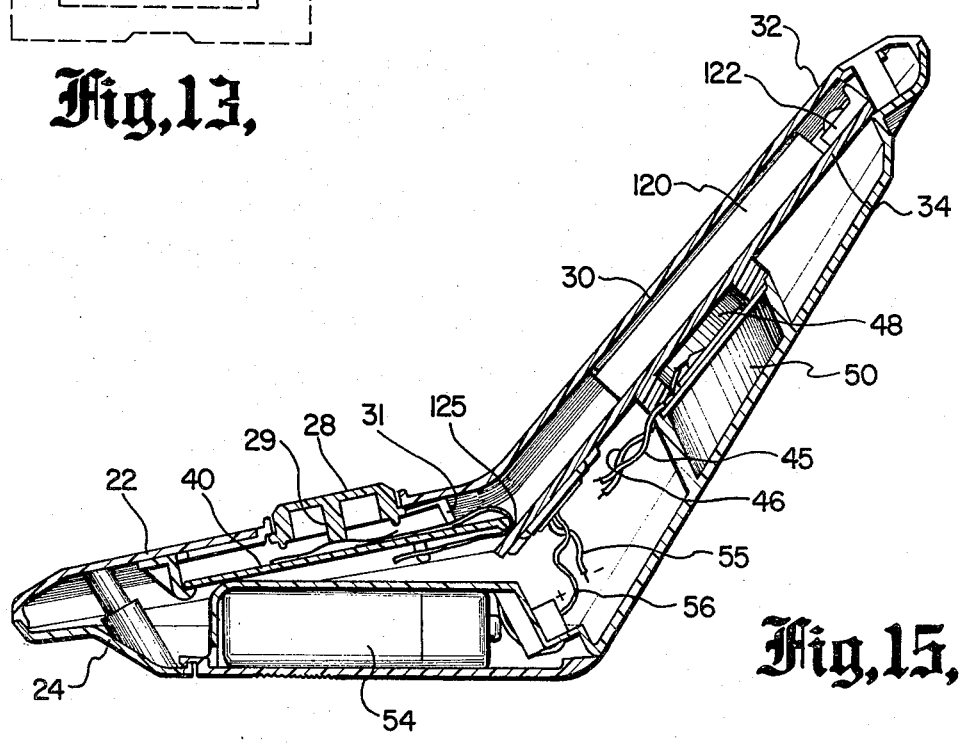
FIG. 15 is a side view, partially in cross-section and partially broken away of the game apparatus of FIGS. 1 through 4 showing interior construction details.

By reference to FIGS. 3, 4 and 13 through 15 the assembly of the game 20 will now be described. After each of the first and second members 34 and 40 have the components mounted thereon and the flexible lamina attached thereto respectively, the assembly is as follows. The keys 26-28 are inserted into matingly configured apertures formed in the upper housing portion 22 with the upper housing portion 22 in a generally inverted position. The support board or member 40 having the keyboard lamina thereon has the lower end thereof inserted into the tab or tang 42 for retention thereby with the dome-shaped portions 98-100 of the lamina 96 abuttingly engaging associated ones of the downwardly depending projections 29 formed on the undersurface of the keys, as shown for key 28 in FIG. 15. Although not shown, as is conventional, the keys 26-28 may be formed in a common mold with an interconnecting sprue 31 which, upon assembly, extends downwardly as shown in FIG. 15 or inwardly relative to the interior surface of the upper housing portion 22. After the support board or member 40 is thus positioned, the first member 34 is then placed into the upper part of the upper housing portion 22 and pressed downwardly until the cutouts 130-133 (see FIG. 13) pass over the tangs 36-39 with the tangs being deformed until the member 34 is fully inserted at which point the tangs 36-39 return to their original position engaging the member 34 captively within the upper housing portion 22. During this insertion, the indexing tab 65 (see FIGS. 5 and 7 through 9) is aligned with an indexing cutout 136 formed in the lower edge of the member 34 (see FIG. 13), this indexing relationship aligning the conductive strips 75-78 of the lamina 68 with the necessary pads 125-128 (only one of which is shown) for providing an abutting electrical contact relationship (see FIGS. 14 and 15). For final assembly, the foam pad 52 is placed within the recess 50 and the speaker 48 is aligned therewith and the lower housing portion 24 is positioned over the upper housing portion 22 and suitably assembled by conventional means such as screws (not shown).

By reference to FIG. 15, the interconnection system according to the invention is especially advantageous when first and second members are required to be electrically interconnected when the first and second members are in non-aligned or angular relation. Cost is a primary consideration in such games and the interconnection system avoids the use of an additional connector and further avoids the requirement for soldering connections between the electrical portions of the two members thus being economical and efficient in manufacture and assembly. The combined effect of the resilient finger-like projections 61-64 in co-acting relation with the conductive strip 75-76 and the looped tail section 70, collectively act as individual spring-like contact members. The individual action of each is further facilitated by the addition of the apertures 109-111 on the tail section 70 as shown in FIG. 12 with the interconnecting slits between those apertures and apertures 90-92 respectively. The indexing tab 65 of the second support member 40 engaging the knockout or cutout 136 of the first member 34 provides a ready method of alignment and indexing the parts relative to each other, and consequently, the alignment of the abutting conductive portions of the parts.

While there has been shown and described a preferred embodiment, it is to be understood that various other adaptations and modifications may be made within the spirit and scope of the invention.

What is claimed is:

1. In an electrical interconnection system, the combination comprising:
 a first member having electrical components thereon and having at least a portion thereof generally rigid with a plurality of electrically conductive members on said rigid portion;
 a second generally rigid member having a plurality of flexible finger-like projections;
 a flexible printed circuit lamina secured to said second member and having a section thereof looped over said projections with a conductive portion on said lamina aligned with each of said projections;
 means on each of said first and second members for aligning said first and second members in proximate relation with said conductive portions of said lamina urged by said finger-like projections into contact with said electrically conductive members; and
 means for maintaining said first and second members in position relative to each other.

2. The combination according to claim 1 wherein said first and second members are positioned in angular relation to each other and said means for maintaining includes housing means.

3. The combination according to claim 1 wherein said plurality of electrically conductive members are printed circuit contact pads.

4. The combination according to claim 3 wherein said pads are in aligned relation.

5. The combination according to claim 1 wherein said first member is a generally rigid generally planar printed circuit board member.

6. The combination according to claim 5 wherein said electrically conductive members include a plurality of aligned pads on said printed circuit board member.

7. The combination according to claim 6 wherein said flexible printed circuit lamina includes a conductive pattern thereon for forming switch means.

8. The combination according to claim 7 wherein said looped section of said lamina includes a plurality of slits at positions intermediate said projections for enabling individual flexing of each conductive portion on said lamina in alignment with each of said projections.

9. The combination according to claim 1 wherein said first member is a generally rigid generally planar printed circuit board member and said electrically conductive members are a plurality of aligned pads.

10. The combination according to claim 9 wherein said flexible printed circuit lamina includes a conductive array for providing switch means.

11. The combination according to claim 10 wherein said second member has the main body portion of said printed circuit lamina secured to a first surface thereof and tab means are provided on the opposite surface of said second member with said looped section having aperture means for coacting with said tab means to retain said section in a looped configuration.

12. The combination according to claim 11 wherein said looped section further includes slits therein generally intermediate said projections for enabling individual flexing of each of said projections with its conductive portion.

13. The combination according to claim 12 wherein said means for maintaining includes housing means.

14. The combination according to claim 13 wherein said housing means includes a lower housing portion having first and second parts thereof in angular relation to each other, said first part having tang means for securing said first member thereto and said second part having tang means for at least partially securing said second member thereto.

15. The combination according to claim 14 wherein said housing means further includes an upper housing portion for matingly coacting with said first housing portion and said upper housing portion receives other means for urging the proximate edges of said first and second members into abutting relation with said conductive portions of said lamina urging against said plurality of pads.

16. The combination according to claim 15 wherein said other means includes keyboard means for deforming at least a portion of said lamina to another portion thereof to effect a switch closure.

* * * * *